US008390083B2

(12) United States Patent
O'Donnell et al.

(10) Patent No.: US 8,390,083 B2
(45) Date of Patent: Mar. 5, 2013

(54) SYSTEM WITH RECESSED SENSING OR PROCESSING ELEMENTS

(75) Inventors: Alan J. O'Donnell, Castletroy (IE); Michael J. Cusack, Newmarket on Fergus (IE); Rigan F. McGeehan, Limerick (IE); Garrett A. Griffin, Castletroy (IE)

(73) Assignee: Analog Devices, Inc., Norwood, MA (US)

( * ) Notice: Subject to any disclaimer, the term of this patent is extended or adjusted under 35 U.S.C. 154(b) by 530 days.

(21) Appl. No.: 12/554,219

(22) Filed: Sep. 4, 2009

(65) Prior Publication Data

US 2011/0057273 A1  Mar. 10, 2011

(51) Int. Cl.
*H01L 27/14* (2006.01)
(52) U.S. Cl. ... 257/414; 257/53; 257/650; 257/E25.009; 438/48
(58) Field of Classification Search .................. 257/414, 257/53, 650; 438/48
See application file for complete search history.

(56) References Cited

U.S. PATENT DOCUMENTS

| | | | |
|---|---|---|---|
| 4,722,914 A | 2/1988 | Drye et al. ..................... | 437/213 |
| 6,118,357 A | 9/2000 | Tomasevic et al. ........... | 333/247 |
| 6,239,496 B1 | 5/2001 | Asada ........................... | 257/777 |
| 6,271,801 B2 | 8/2001 | Tuttle et al. .................. | 343/872 |
| 6,309,912 B1 | 10/2001 | Chiou et al. .................. | 438/118 |
| 6,528,351 B1 | 3/2003 | Nathan et al. ................. | 438/118 |
| 6,639,324 B1 | 10/2003 | Chien ............................ | 257/778 |
| 6,844,606 B2 | 1/2005 | Logsdon et al. .............. | 257/434 |
| 6,913,949 B2 | 7/2005 | Pflughaupt et al. ........... | 438/109 |
| 6,917,089 B2 | 7/2005 | Schuurmans et al. ........ | 257/427 |
| 6,928,726 B2 | 8/2005 | Zollo et al. ..................... | 29/832 |
| 6,987,661 B1 | 1/2006 | Huemoeller et al. ......... | 361/312 |
| 7,002,254 B2 | 2/2006 | Harper et al. ................. | 257/777 |
| 7,112,885 B2 | 9/2006 | Chen et al. .................... | 257/728 |
| 7,134,193 B2 | 11/2006 | Sasaoka et al. ................ | 29/825 |
| 7,183,643 B2 | 2/2007 | Gibson et al. ................. | 257/723 |
| 7,196,426 B2 | 3/2007 | Nakamura et al. ............ | 257/778 |
| 7,198,986 B2 | 4/2007 | Sunohara ...................... | 438/109 |
| 7,214,565 B2 | 5/2007 | Sunohara ...................... | 438/108 |
| 7,217,888 B2 | 5/2007 | Sunohara et al. ............. | 174/260 |
| 7,230,318 B2 | 6/2007 | Kripesh et al. ................ | 257/621 |

(Continued)

FOREIGN PATENT DOCUMENTS

DE     10056776       11/2001
WO    WO 02/01633       1/2002

(Continued)

OTHER PUBLICATIONS

Tuytschaevers, T.J., Article 19 Amendment as filed; PCT/US2010/046354, Aug. 23, 2010, 7 pages.

(Continued)

*Primary Examiner* — Jerome Jackson, Jr.
*Assistant Examiner* — Dale E Page
(74) *Attorney, Agent, or Firm* — Sunstein Kann Murphy & Timbers LLP

(57) ABSTRACT

Backside recesses in a base member host components, such as sensors or circuits, to allow closer proximity and efficient use of the surface space and internal volume of the base member. Recesses may include covers, caps, filters and lenses, and may be in communication with circuits on the frontside of the base member, or with circuits on an active backside cap. An array of recessed components may a form complete, compact sensor system.

19 Claims, 12 Drawing Sheets

U.S. PATENT DOCUMENTS

| | | | |
|---|---|---|---|
| 7,242,089 B2 | 7/2007 | Minervini | 257/704 |
| 7,242,591 B2 | 7/2007 | Imamura et al. | 361/761 |
| 7,251,391 B2 | 7/2007 | Murayama | 385/15 |
| 7,286,366 B2 | 10/2007 | Zollo et al. | 361/761 |
| 7,288,433 B2 | 10/2007 | Haba et al. | 438/107 |
| 7,312,536 B2 | 12/2007 | Yamano et al. | 257/787 |
| 7,319,049 B2 | 1/2008 | Oi et al. | 438/106 |
| 7,319,598 B2 | 1/2008 | Steiner et al. | 361/760 |
| 7,325,301 B2 | 2/2008 | Miura | 29/852 |
| 7,326,932 B2 | 2/2008 | Hynes et al. | 250/353 |
| 7,335,531 B2 | 2/2008 | Iijima et al. | 438/106 |
| 7,340,121 B2 | 3/2008 | Yonekura et al. | 385/14 |
| 7,426,868 B2 | 9/2008 | Fessele et al. | 73/756 |
| 7,517,712 B2 | 4/2009 | Stark | 438/51 |
| 7,697,301 B2 | 4/2010 | Lee et al. | 361/763 |
| 7,834,438 B2 | 11/2010 | Shiraishi et al. | 257/684 |
| 8,018,032 B2 | 9/2011 | Lu | 257/622 |
| 2003/0059976 A1 | 3/2003 | Nathan et al. | 438/106 |
| 2004/0016995 A1 | 1/2004 | Kuo et al. | 257/678 |
| 2005/0046011 A1 | 3/2005 | Chen et al. | 257/705 |
| 2005/0046041 A1 | 3/2005 | Tsai | 257/778 |
| 2005/0087356 A1* | 4/2005 | Forcier | 174/52.4 |
| 2005/0176209 A1 | 8/2005 | Jorgenson et al. | 438/381 |
| 2006/0215379 A1 | 9/2006 | Zollo et al. | 361/761 |
| 2006/0246630 A1 | 11/2006 | Sunohara et al. | 438/125 |
| 2006/0258053 A1 | 11/2006 | Lee et al. | 438/118 |
| 2006/0283627 A1 | 12/2006 | Chen et al. | 174/260 |
| 2007/0029654 A1 | 2/2007 | Sunohara et al. | 257/678 |
| 2007/0126102 A1 | 6/2007 | Mohammed et al. | 257/686 |
| 2007/0128754 A1 | 6/2007 | Fuergut et al. | 438/48 |
| 2007/0131349 A1 | 6/2007 | Tuominen et al. | 156/280 |
| 2007/0132536 A1 | 6/2007 | Lee et al. | 336/200 |
| 2007/0158822 A1 | 7/2007 | Fujii | 257/704 |
| 2007/0177360 A1 | 8/2007 | Shiraishi et al. | 361/740 |
| 2007/0181988 A1 | 8/2007 | Han et al. | 257/678 |
| 2007/0187826 A1 | 8/2007 | Shim et al. | 257/738 |
| 2007/0190686 A1 | 8/2007 | Wang | 438/106 |
| 2007/0241451 A1 | 10/2007 | Koizumi et al. | 257/719 |
| 2007/0290329 A1 | 12/2007 | Murayama et al. | 257/704 |
| 2008/0029879 A1 | 2/2008 | Tuckerman et al. | 257/704 |
| 2008/0040921 A1 | 2/2008 | Zollo et al. | 29/837 |
| 2008/0050847 A1 | 2/2008 | Gluschenkov et al. | 438/6 |
| 2008/0054486 A1 | 3/2008 | Murayama et al. | 257/774 |
| 2008/0073768 A1 | 3/2008 | Shiraishi et al. | 257/684 |
| 2008/0094805 A1 | 4/2008 | Tuominen et al. | 361/728 |
| 2008/0171172 A1 | 7/2008 | Bae et al. | 428/67 |
| 2008/0192450 A1 | 8/2008 | Tuominen et al. | 361/761 |
| 2008/0196930 A1 | 8/2008 | Tuominen et al. | 174/260 |
| 2008/0202801 A1 | 8/2008 | Tuominen et al. | 174/260 |
| 2009/0041913 A1 | 2/2009 | Weber et al. | 426/279 |
| 2009/0096041 A1* | 4/2009 | Sakakibara et al. | 257/419 |
| 2009/0101998 A1 | 4/2009 | Yen et al. | 257/416 |
| 2010/0059877 A1* | 3/2010 | Leib et al. | 257/704 |
| 2010/0308450 A1 | 12/2010 | Verjus et al. | 257/690 |

FOREIGN PATENT DOCUMENTS

| | | |
|---|---|---|
| WO | WO 02/45463 A2 | 6/2002 |
| WO | WO 2005/086532 A2 | 9/2005 |
| WO | WO 2005/102911 A1 | 11/2005 |
| WO | WO 2006/061792 A2 | 6/2006 |
| WO | WO 2007/117198 A1 | 10/2007 |

OTHER PUBLICATIONS

Wolffenbuttel, R.F., Microsystems for Multi-Sensory Data-Acquisition,) IEEE International Symposium on Industrial Electronics, 1997, 6 pages.

Authorized Officer: Andreas Götz, International Search Report, PCT/US2010/046354, Apr. 7, 2010, 6 pages.

Authorized Officer: Andreas Götz, Written Opinion of the International Searching Authority; PCT/US2010/046354, Apr. 7, 2010, 10 pages.

European Patent Office, Invitation to Pay Additional Fees and Annex for Form PCT/ISA/206, dated Feb. 23, 2011, PCT/US2010/046354 filed Aug. 23, 2010, 8 pp.

Kopola, H., et al., "MEMS Sensor Packaging Using LTCC Substrate Technology," *Proceedings of SPIE*, vol. 4592, 2001, pp. 148-158.

Ravi Mahajan, et al., *Emerging Directions for Packaging Technologies*, Intel Technology Journal, vol. 6, Issue 2, May 16, 2002, 16 pages.

Steven N. Towle, et al., *Bumpless Build-Up Layer Packaging*, Proceedings ASME Int. Mech. Eng. Congress and Exposition (IMECE) New York, Nov. 11-16, 2001, 7 pages.

Prismark Partners LLC, *Technology Forecast and Impact Analysis of PCB Embedded Components*, Mar. 2007, 16 pages.

\* cited by examiner

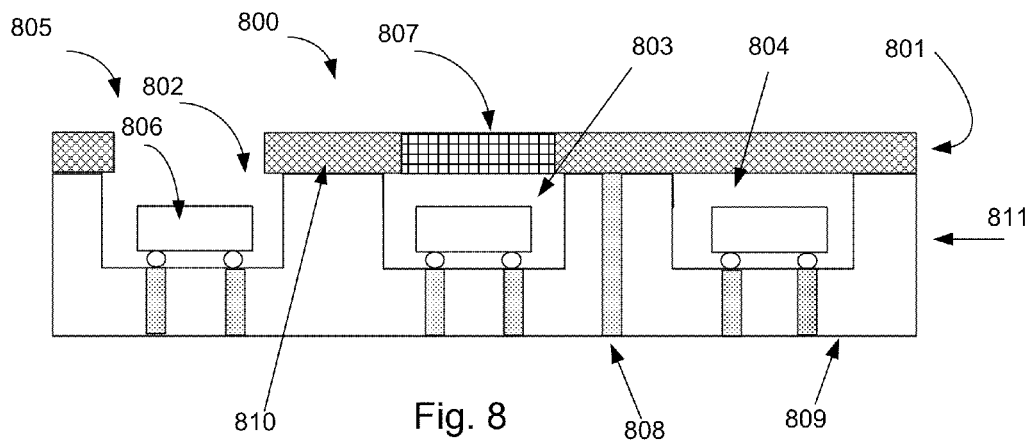
Fig. 8
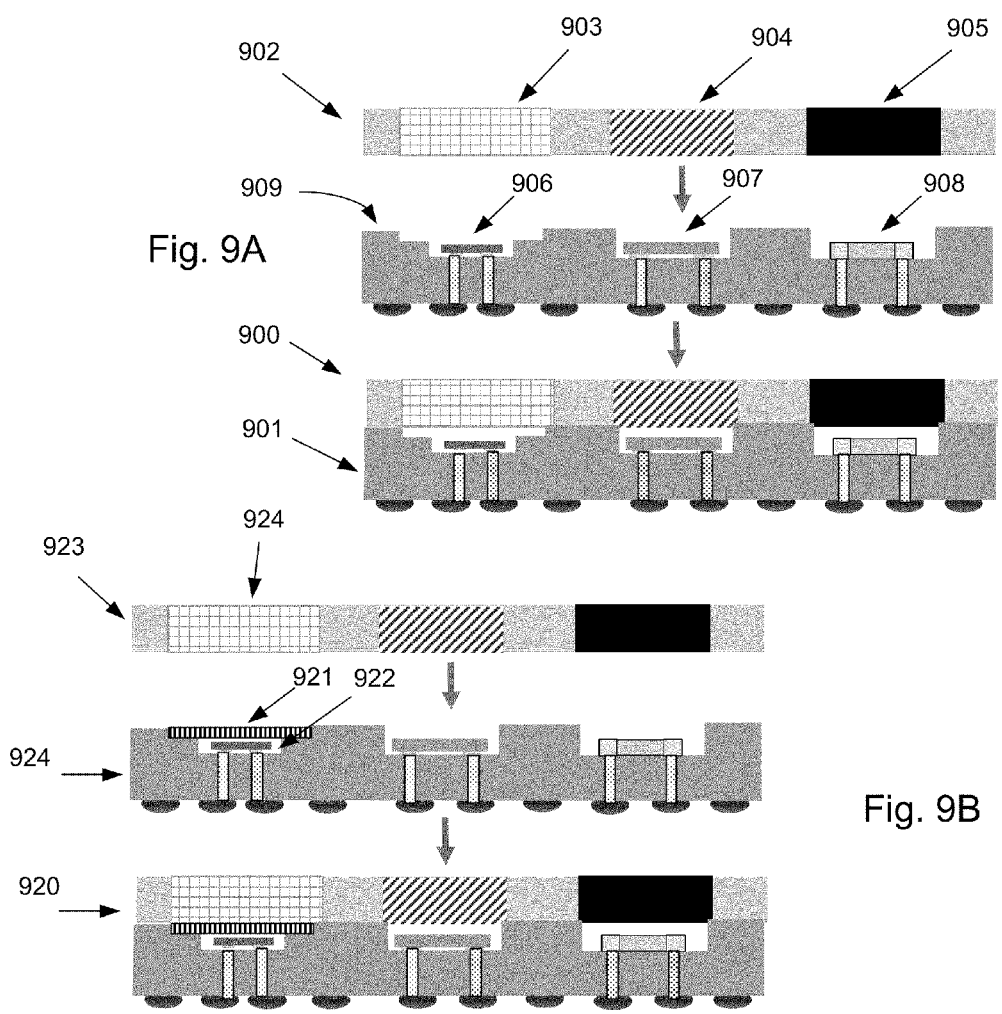
Fig. 9A
Fig. 9B

SYSTEM WITH RECESSED SENSING OR PROCESSING ELEMENTS

TECHNICAL FIELD

The present invention relates to electronic assemblies, and more particularly to electronic assemblies with embedded sensors and processing circuitry.

BACKGROUND ART

Electronic assemblies may be composed of a number of components. It is known in the art to mount sensor and signal processing components to a surface of a substrate. Some applications, known as "flip chip," mount integrated circuits directly to a surface of a substrate. Other applications house a sensor or integrated circuit in a package. The package may include a lead frame, with one or more die are mounted on the leadframe. The leadframe and die are then encapsulated, and the package is mounted to a substrate, such as a printed circuit board, for example. It is known to increase the density of components on a substrate by stacking several integrated circuits within a single package, such as in U.S. Pat. No. 6,784,023, entitled "Method Of Fabrication Of Stacked Semiconductor Devices," or U.S. Pat. No. 6,593,662 entitled "Stacked-Die Package Structure," and then mounting the package to a substrate such as a printed circuit board. Some packages mount a single integrated circuit within a recess in a substrate within a package, such as U.S. Pat. No. 7,002,254, entitled "Integrated Circuit Package Employing Flip-Chip Technology And Method Of Assembly." In any of these approaches, each component or package occupies real estate on the surface of the printed circuit board.

FIG. 1 schematically illustrates one type of stacked chip package 100 as known in the art. The package includes a lead frame 101 comprised of a paddle 102 and leads 103. The paddle 102 supports two stacked integrated circuits 104 and 105. The integrated circuits are interconnected by solder balls 106. The stacked integrated circuits 104 and 105 are coupled to the paddle portion 102 of the lead frame 101 by other solder balls 106. Some stacked assemblies provide wire bonds (not shown) to couple an integrated circuit to another integrated circuit in the stack, or to the lead frame. The integrated circuits 104 and 105, paddle 102, solder balls 106, and a portion of leads 103 are encapsulated in encapsulant 107. The package 100 is mounted to a substrate 108 via leads 103 extending from the paddle 102 of the lead frame 101 to the outside of the encapsulant 107. The mounted package 100 effectively occupies the portion of the substrate 108.

Flip-chip mounting as known in the art is schematically illustrated in FIG. 2. The integrated circuit 200 is coupled to the substrate 201 by solder balls 202. The mounted chip 200 effectively occupies the portion of the substrate 201. The chip 200 is exposed to its environment without the benefit of a surrounding package, and is therefore susceptible to damage from contact with other objects in the environment, in addition to other environmental factors, such as heat, dust, humidity, etc.

A prior art arrangement 300 of packaged sensors or integrated circuits 301 mounted to a substrate 302 is schematically illustrated in FIG. 3. The area, or "footprint," occupied by each package 301 is larger than the circuit or sensor within the package. Together, the three mounted packages 301 occupy a portion of the surface area of the substrate 302 that is larger than the sum of their individual footprints.

Design rules for mounting packages, and the physical dimensions of the packages themselves, will require certain spacing between the devices. The real estate occupied will be even larger if room must be made for surface interconnections or a discrete component, such a resistor 303. Another consequence of this approach is that one sensor may be some distance from another sensor, possibly hampering their ability to sense or measure the same local environment. Spreading out the components 301 also requires longer interconnection conductors than a more compact layout, possibly leading to increased parasitic capacitances, or increased susceptibility to noise coupling to the signals.

SUMMARY OF THE INVENTION

In a first embodiment of the invention there is provided a substrate having a frontside surface comprising circuitry, and a backside surface comprising a plurality of recesses. A plurality of the recesses have at least one sensor, and a port configured to expose the sensor to the environment external to the recess. A sensor may detect a characteristic of the external environment, or energy from the environment that impinges on the sensor. Some embodiments employ inertial sensors without exposing the inertial sensors directly to the external environment. The frontside of the substrate may include circuitry configured to receive a signal from at least one of the sensors. In some embodiments, the circuitry may also control the sensor, or a plurality of sensors. The port may comprise an aperture, a transparent portion, a filter, or a lens, in some embodiments. In some embodiments, the assembly may include a cap, and the cap may comprise an aperture, a transparent portion, a filter, or a lens, or circuitry. In some embodiments, some ports may be sealed from the outside environment while allowing some environmental external recess. In some embodiments, the substrate may be a semiconductor, while in other embodiments the substrate may be a laminated body, or other material.

BRIEF DESCRIPTION OF THE DRAWINGS

The foregoing features of the invention will be more readily understood by reference to the following detailed description, taken with reference to the accompanying drawings, in which:

FIG. 8 schematically illustrates another embodiment of the present invention;

FIG. 9A and FIG. 9B schematically illustrate embodiments of the present invention and their fabrication;

DETAILED DESCRIPTION OF SPECIFIC EMBODIMENTS

A system with recessed sensing or processing elements has a base with a backside surface and a frontside surface. The backside surface has a number of recesses that host circuit elements, such as die, sensors, discrete elements, or integrated circuits. Some embodiments expose the recesses to the environment, while others seal the recesses, while still others expose the recess to the environment through a lens or filter. Some embodiments include a cover or backside cap member, to cover the recesses or support the covers. In some embodiments, the backside cap member may completely seal one or more recesses, may leave some recesses open to the environment, or may include filters or lenses.

Figure 1:
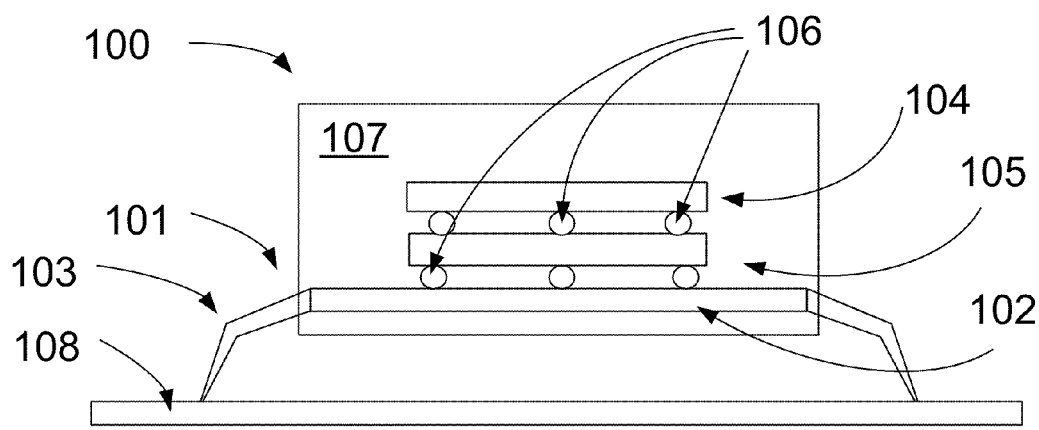
FIG. 1 schematically illustrates a stacked chip package as known in the art.
Figure 2:
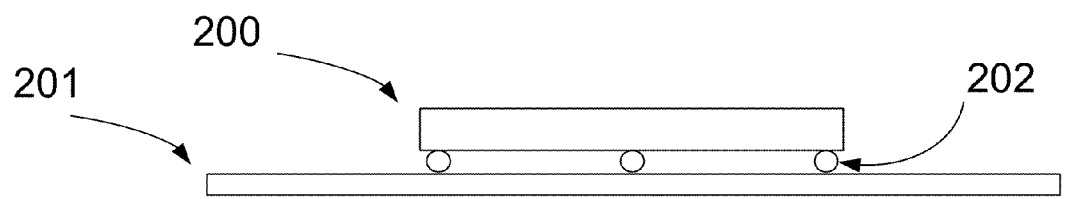
FIG. 2 schematically illustrates a flip-chip mounting as known in the art.
Figure 3:
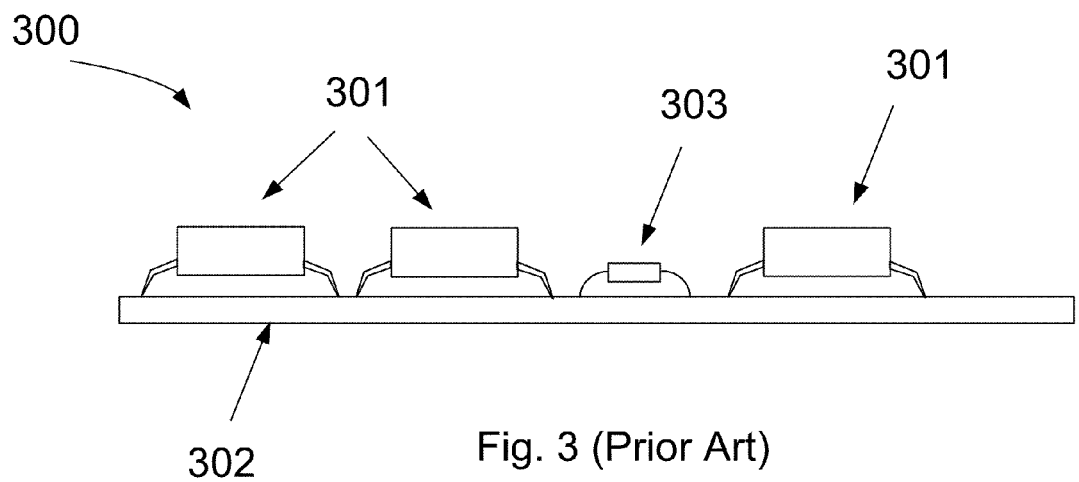
FIG. 3 schematically illustrates a prior art printed circuit board with packaged integrated circuits.
Figure 4:
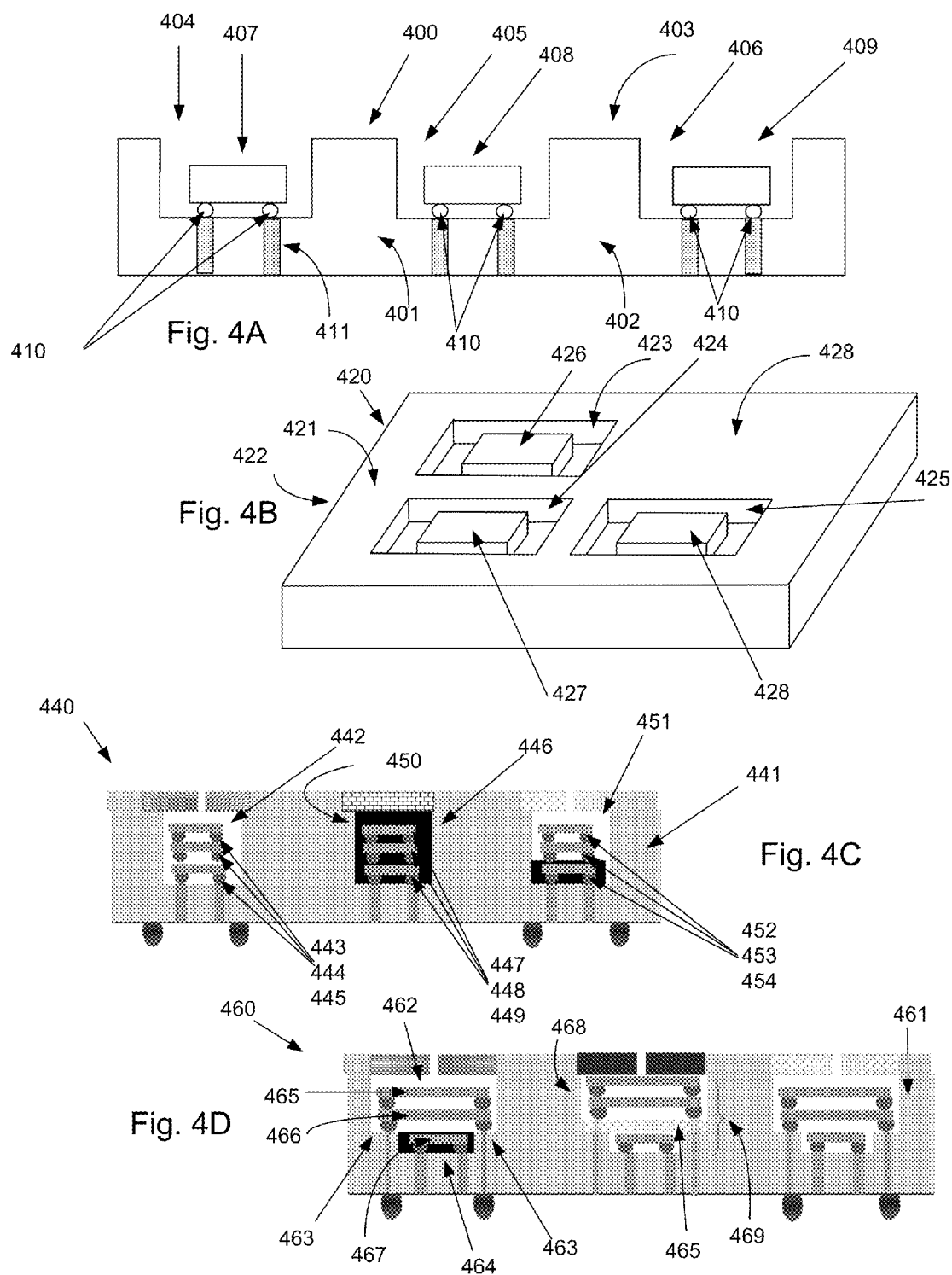
FIG. 4A schematically illustrates an embodiment of the present invention.
FIG. 4B schematically illustrates a perspective view of an embodiment of the present invention.
FIG. 4C and FIG. 4D schematically illustrates an embodiments of the present invention.

FIG. 4A schematically illustrates a cross-section of an illustrative embodiment of an embedded multi-sensor assembly. In this embodiment, the sensor assembly 400 has a base 401 with a frontside surface 402 and a backside surface 403. The frontside surface 402 may have active circuits, while the backside surface 403 may be inactive. The backside surface 403 includes a number of recesses 404, 405, 406 that each contain at least one sensor 407, 408, 409. Each sensor in FIG. 4A is exposed to the environment and thus may sense an external environmental property. For example, the sensor may sense pressure, gas type, humidity, or incident radiation.

FIG. 4B schematically illustrates a perspective view of an illustrative embodiment. The backside surface 421 of the base 422 includes an array of recesses 423, 424, 425 that, in this illustration, each include a die 426, 427, 428 that could be a sensor or an integrated circuit, for example. In some embodiments, the arrangement of the recessed elements, such as the proximity of one recessed element to another, may be influenced by the requirements of the system being designed.

FIG. 4C schematically illustrates a cross-section of an illustrative embodiment of an embedded multi-sensor assembly 440 in which a plurality of die are stacked within a recess. A recess 442 may be open to the external environment and include, for example, three gas sensors 443, 444, 445, each sensitive to different concentrations of the same gas, or to two or more different gasses. A recess 446 could host, for example, three inertial sensors 447, 448, 449, such as three single-axis accelerometers, each arranged to sense acceleration in one of three orthogonal axes. If an encapsulant would not interfere with the operation of a sensor, such as a capped MEMS device, the recess may be filled with encapsulant, such as an epoxy 450, as illustrated. Some embodiments may encapsulate fewer than all of the stacked chips in a recess. For example, a reference sensor 454 could be encapsulated while other sensors 452, 453 are not encapsulated, as illustrated. FIG. 4D schematically illustrates a cross-section of an illustrative embodiment of an embedded multi-sensor assembly 460 in which a plurality of die 465, 466, 467 are stacked within a recess 462 in the base 461. In this embodiment, the recesses include shoulders 463 that facilitate selective encapsulation 464 of a die 467, or the inclusion of an intermediate cap or lens, etc. 465, within the recess 468 and within a stack of die 469.

In contrast to a prior art substrate with elements mounted on its surface, these illustrated embodiments do not cause the sensors or integrated circuits to occupy portions of the frontside surface. Portions of the frontside surface that would otherwise be covered by mounted sensors, or mounted integrated circuits, are therefore free to include conductors or other circuits that may, for example, receive, conduct or process signals, including for example signals to or from the sensors. The close proximity of the devices also provides an opportunity to reduce the length of interconnection conductors, possibly reducing parasitic capacitances, signal delays, or noise.

The base may be formed from a semiconductor wafer or silicon-on-insulator ("SOI") wafer, in which case the circuits on the active surface may be integrated circuits. In some embodiments, the base may be formed from another material or materials, or may be a laminated member.

One advantage of the multisensor system of FIGS. 4A-4D is that the may incorporate elements with a variety of characteristics that may be very difficult to fabricate in a single wafer with known semiconductor processes, such as circuits fabricated with incompatible fabrication processes, or circuits using different varieties of transistors, different geometries, discrete elements, passive elements, or MEMS structures.

Illustrations of various embodiments discussed herein may include multiple features. Some features, however, may be combined, or mixed and matched, in ways not illustrated in the figures. A complete catalog of all variations and combinations is not practicable. Persons of ordinary skill in the art will be able to conceive many variations and combinations.

In the following examples, the term "environmental media," when used in connection with a sensing or measurement, has a meaning that includes, but is not limited to, the physical make-up of the environment being measured or sensed, or some quality, property, or characteristic of that environment (e.g., temperature, pressure, humidity), or something being transmitted via or through the environment (e.g., acoustic energy; electromagnetic energy; light), or other properties of the environment or apparatus, such as acceleration or rotation.

Examples of Multi-Chip/Multi-Sensor Systems

In one embodiment, the system of FIG. 4A has a plurality of sensors that detect or measure different environmental properties. For example, the system 400 of FIG. 4A may include an array of sensors 407, 408, 409, each of which detects a specific target gas. The array could provide information on whether the specific gasses are present in the array's environment. In some embodiments, circuits (possibly on the active surface of the base, or in a recess) could then process the output of the sensors 407, 408, 409 at one time, or at various times to determine what gasses are present in the array's environment, or how the make-up of the environment is changing over time. Such an embodiment makes more efficient use of available substrate real estate as compared, for example, to an array of sensors mounted on a surface of a substrate, which would occupy greater area, and therefore cause the sensor system to be larger. Also, the physical proximity of the sensors or integrated circuits to each other may increase the accuracy of their ability to measure their local environment.

Circuitry on the base or on circuits within the recesses could coordinate the operation of such sensors. For example, if all sensors need to sense or sample the environment at the same time, or in a defined sequence, the circuitry control the operation of the sensors in time. If a sensor has an adjustable parameter, such as sensitivity or sample size, circuitry may control those parameters. If a sensor stores data, the circuitry may read the data from the sensor, for example at an appropriate time. In embodiments that include a reference sensor and a sensor to sample the environment, the circuitry may control the timing of the sampling by both sensors, and then determine the net measurement by comparing the outputs of the two sensors. The proximity of the sensors to the controlling circuitry may facilitate cleaner timing and data signals.

While the sensors 407, 408, 409 in FIG. 4A are illustrated as coupled to the bottom surface of the recess 404, 405, 406 by solder balls 410, other mounting methods known in the art may also be used. For example, integrated circuit 708 in FIG. 7(*c*) is mounted directly to vias 702 by electrodes 716 electrodes 715 at the bottom surface of the recess 714.

In illustrative embodiments, multiple sensors detect or measure the same environmental media, but are calibrated for different sensitivities. As such, the system can provide a highly accurate reading of a specific environmental property. For example, the sensor system 400 of FIG. 4A may include a number of sensors, all of which detect the same target gas, but at different concentrations. The output of the sensor array could produce a highly accurate reading of the concentration of the target gas. For example, a first sensor 407 may be able to sense high concentrations of the target gas, but it may not be able to make distinctions between relatively lower levels of the gas. Therefore, the system may include a second sensor 408 with different sensitivity to the target gas. When the amount of target gas present in the environment is at a level lower than the first sensor 407 can detect, that level may be comfortably within the range of the second sensor 408. Alternately, when the amount of target gas present in the environment is at a level that exceeds the second sensor's range 408, that level may be comfortably within the range of the first sensor 407. It should be noted that gas sensors are used as examples only, and do not limit the types of sensors, integrated circuits, or die that may be mounted in a recess.

FIG. 4A could also represent another exemplary embodiment that includes a number of sensors that sense different media, energies or other properties. For example, one sensor 407 may detect pressure, while another sensor 408 detects a type of gas in the environment, while another 409 senses light. Alternately, for example, one sensor 407 may detect a target gas, while another sensor 409 is a MEMS accelerometer that detects the amount and direction of acceleration, while another 409 senses infrared radiation.

The proximity of the various sensors and integrated circuits in the foregoing examples may facilitate or enable several desirable features. For example, placing sensors in close proximity to one another may enable them to more accurately sense the environment at nearly the same point in space. Such proximity may facilitate comparisons between like sensors, or measurement accuracy among unlike sensors. Also, placing sensors in close proximity to processing circuitry may facilitate fast communication with reduced noise, and lower parasitic capacitance. In addition, the recesses provide some protection against damage from physical contact between the sensor or integrated circuit and an object from the external environment. A sensor or integrated circuit within a recess may also avoid the need for individual packaging, thus saving manufacturing costs and time, as well as system weight.

Figure 5:
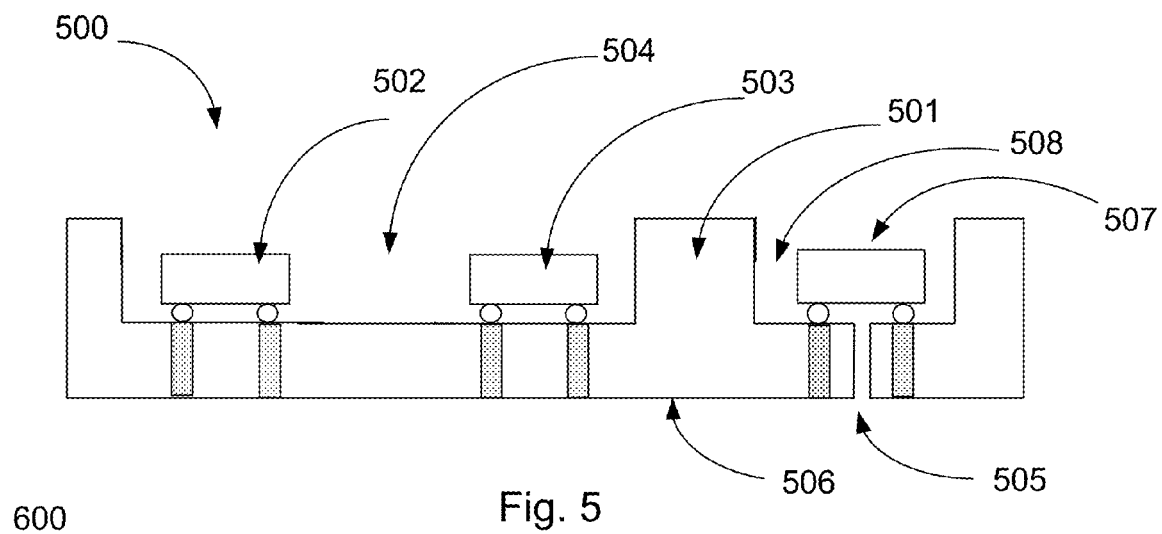
FIG. 5 schematically illustrates an alternate embodiment of the present invention.

Alternate embodiments could be represented by the system 500 of FIG. 5, in which two sensors or integrated circuits or other circuit elements or devices 502, 503 occupy a single recess 504 in the base 501. In some embodiments, the two devices may be in a stacked configuration, or may be side-by-side (e.g., mounted on substantially the same plane). In some embodiments, a portion of a sensor or integrated circuit may extend outside of the base recess (not shown), for example, if a sensor is taller than the depth of the recess. In illustrative embodiments, an aperture 505 may extend from the recess 508 to the frontside 506 of the base 501. Such an aperture 505 may allow environmental media from the area around the frontside 506 of the base 501 to reach a sensor 507 in the recess 508.

Covers

Figure 6:
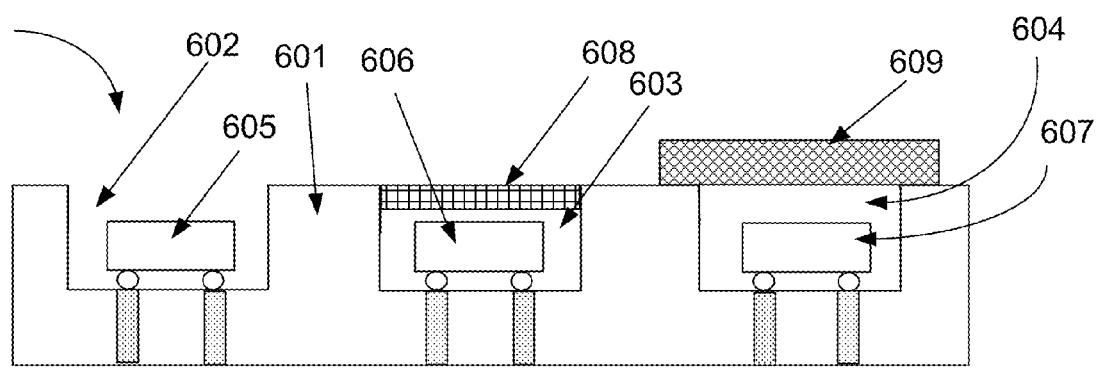
FIG. 6 schematically illustrates another embodiment of the present invention.

Some applications of various embodiments may benefit from covering, partially or completely, one or more of the recesses. Some embodiments may include one or more covers or caps, filters or lenses in, or covering, one or more recesses. In some embodiments, a cover completely covers a recess, such as covers 608 and 609 covering recess 603 and 604 in FIG. 6. Some embodiments may leave one or more recesses open to the environment, such as recess 602 in FIG. 6.

The amount of desirable exposure to the outside environment may depend on what environmental media the sensor is designed to sense. In some embodiments, a gas sensor, for example, may need to be fully exposed to its environment in order to sample the gases in that environment. In some embodiments, an opening from the recess to the environment may be smaller than the dimensions of the recess, and sized according to the application, such aperture 805 in FIG. 8, for example. In some embodiments, an acoustic sensor or microphone may benefit from an opening with dimensions (e.g., diameter and depth) sized to act as a filter for selected frequencies. The system designer would determine the dimensions of an opening based on the needs of the system and the make-up of the environment, for example.

Other sensors may not require direct exposure to the external environment, and so their host recesses may be closed, or even sealed-off from the external environment. A light or infrared sensor, for example, may sense incident energy through a cover that is transparent to the radiation being sensed. For example, some plastic encapsulants used in the semiconductor industry are transparent to infrared radiation, but opaque to light in the visible spectrum.

Some applications may benefit from having a filter that selectively passes environmental media into or out of a recess. Some applications may benefit from having a lens that focuses environmental media as it passes into a recess. Illustrative embodiments may include a cover, filter or lens, or a cover that includes or embodies a filter or lens. A cap or cover that embodies a lens is described in U.S. Pat. No. 7,326,932, entitled "Sensor and Cap Arrangement." A cover may also include a more traditional optical lens, for example. In some embodiments, a cover may also include a transparent portion that is polarized, to polarize any incident electromagnetic radiation as it passes into the recess.

Some sensors may not require any opening or exposure to the external environment. An inertial sensor such as an accelerometer or gyroscope, for example, can detect inertial forces and gravity without any opening to the outside environment. In some embodiments, a recess may be sealed to isolate the recess from the external environment, such as recess 604 in FIG. 6, for example.

In some embodiments, one or more sensors could be shielded from the ambient environment to act as reference sensors. For example, in some embodiments an infrared sensor is sealed within a recess such that no external infrared radiation impinges on the sensor, while another, nominally identical infrared sensor is exposed to the environment. Such an embodiment may be illustrated by FIG. 6, in which sensor 607 is sealed by cover 609 into recess 604, while sensor 605 in recess 602 is open to the environment. The quantity of infrared radiation in the environment could be distinguished from sensor output resulting from heat within the sensor or system by comparing the output of the exposed sensor 605 to the output of the reference sensor 607. Shielding a sensor may be accomplished, for example, by sealing the recess or completely embedding the sensor with the base.

The recess may be filled with fill material, such as a thermoplastic. In embodiments with a sensor that has moving parts, such a MEMS device, however, the host recess may be covered but remain unfilled, so that no encapsulant or filler interferes with the motion of the moving parts. In some embodiments, recesses hosting MEMS devices, for example, may be left uncapped and unfilled. In other embodiments, the recess and a cap or cover may form a void.

Vias

Some applications may benefit from the ability to transmit signals to and from a recess to another point in the system. As such, some embodiments may include one or more vias through the base. For example, a via 411 as illustrated in FIG. 4A may extend from the recess 404 to the frontside 402 of the base 400, to electrically connect the sensor 407 to the active surface 402, as illustrated in FIG. 4A. Such a via 411 may be known as a "recess via," as a species of "through-silicon" via. Such vias may provide power and ground connections, carry control signals to or from the sensor, or carry output signals from the sensor to circuits on the active surface, for example.

Some embodiments may include vias all the way through the base, such as the long, vertical via 808 in FIG. 8, for example. Such a via may be known as an "intra-surface via," also a species of "through-silicon" via. In some embodiments, a signal from a sensor 407 in a recess 404 may travel through a recess via 411 to the frontside of the base 402, and then through another via (such as via 1 FIG. 8 but not illustrated in FIG. 4) from the frontside surface 402 to the backside surface 403, or circuitry in or on the backside surface. In some embodiments, a sensor 407 in a backside recess 404 may produce a signal that leaves the recess 404 and travels through a recess via 411 to the frontside 402. Integrated circuits on the frontside 402 may process the signal and pass it to another via 808 that carries the processed signal to the backside surface 403. Circuits on the backside 403, or in a backside cap, may further process the signal. Alternately, bond pads on the backside surface may be coupled to other circuits to send the signal off of the sensor assembly for further processing or transmission.

Fabrication of Base

Figure 7:
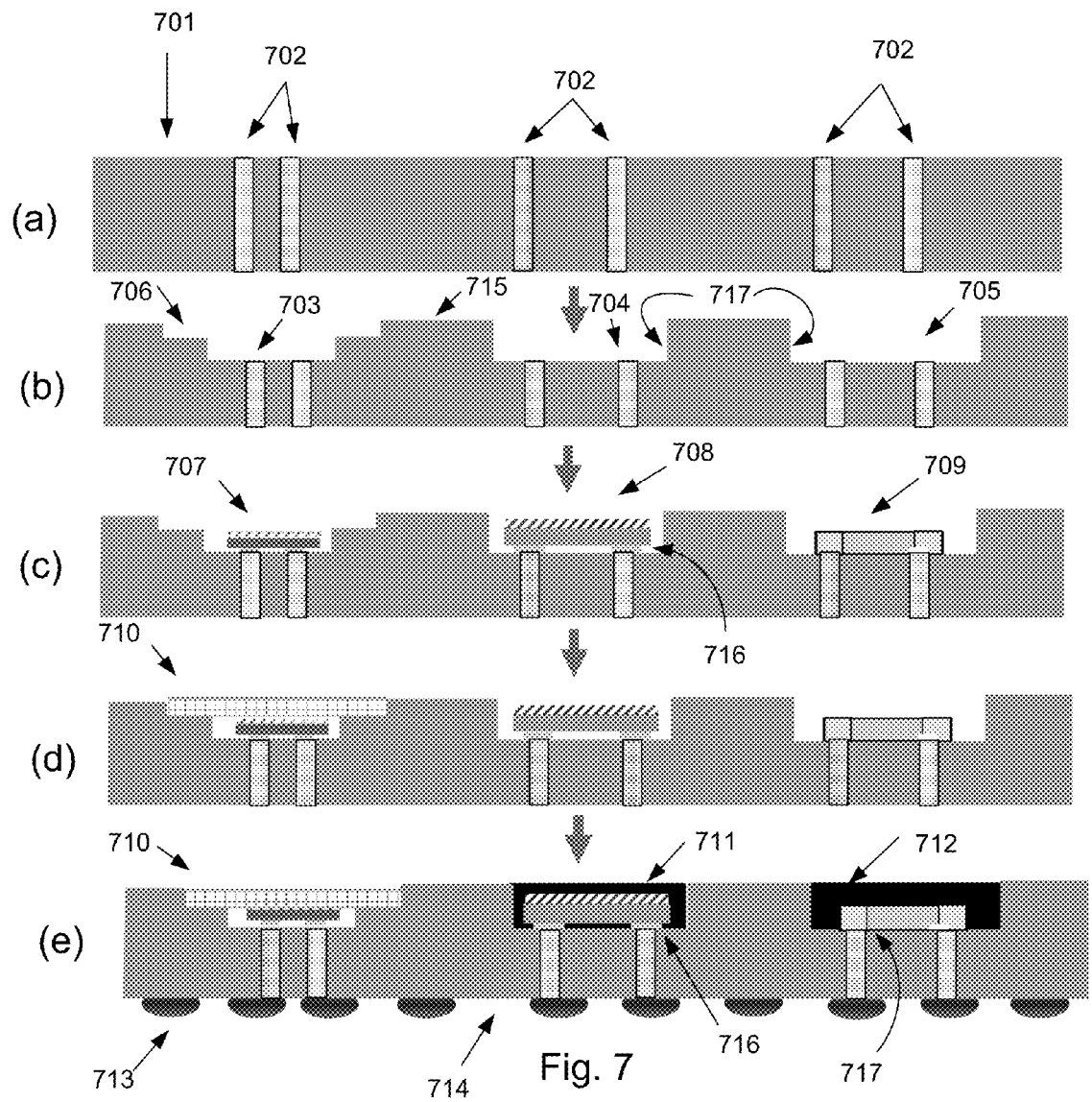
FIG. 7 schematically illustrates an exemplary process for fabricating a multi-sensor system.

A sequence of illustrations in FIG. 7 illustrate a process for fabricating an embodiment of a multi-sensor system 700 with recessed sensors. In one embodiment, a semiconductor substrate 701 with vias 702 is provided, as shown in FIG. 7(*a*). In alternate embodiments, vias 702 may be fabricated at a later stage. Recesses 703, 704, 705 are etched into the base 701 at the location of the vias 702, in FIG. 7(*b*). The vias 702 may now be thought of as recess vias, since for example one end of each via 702 terminates in the recess 703. In alternate embodiments, vias 702 may be formed after the recesses are etched.

In some embodiments, one or more recesses 704, 705 may have vertical sidewalls 707 from the bottom of the recess 704, 705 to the top, while others may have angled sidewalls (not shown). Alternately, the sidewalls may incorporate a lip or shoulder 706 to facilitate mounting of a lens or filter, for example. In FIG. 7(*c*), sensors or integrated circuits or discrete components 707, 708, 709 are mounted in the recesses 703, 704, 705, and possibly coupled to recess vias 702 either directly 717, or via an electrode 716. One or more recesses may be partially or completely covered with a cover 710, while other recesses may be filled with an encapsulant 711, 712, as illustrated in FIGS. 7(*d*) and 7(*e*). The encapsulant may be a solid material (e.g., may be solid when cooled or cured), or may be a gel. As shown in FIG. 7(*e*), connectors, such as solder bumps, may be added to the frontside surface 714 for use in mounting the multi-sensor system to another surface, or for making other connections, for example. Some of the connectors 714 may connect directly with vias 702 from the recesses.

Backside Cap Wafer

Some applications may benefit from mounting a cap member to the backside surface. Such a cap member could protect an embedded sensor, or provide signal processing capacity, for example. Some embodiments 800 may include a backside cap wafer 801 that covers one or more of the recesses 802, 803, 804, as illustrated in FIG. 8. A backside cap wafer 801 may include an aperture 805 to expose a recess 802 and sensor 806 to the environment, or may include a filter or lens 807 above a recess 803. Other recesses 804 may be completely enclosed by the backside cap wafer 801.

Some applications may benefit from including circuitry on a backside cap wafer 801. As such, a backside cap wafer may also include circuitry in some embodiments, such as integrated circuitry, or even other sensors. In some embodiments, a via 808 may extend from the frontside surface 809 to the backside 810 of the base 811 (e.g., an inter-surface via), to transmit power, ground, or signals to and from a backside cap wafer 801.

A backside cap wafer 801 in some embodiments may be fabricated from the same material as the base 811. In such an embodiment, the base 811 and the backside cap 801 wafer may exhibit similar coefficients of thermal expansion, which may make the assembly stronger, easier to manufacture, or better able to withstand temperature variations.

One method of fabricating such a capped wafer 900 is illustrated in FIG. 9A. A base wafer 901 with recesses 906, 907, 908, such as are described above for example, is provided, and an opposing cap wafer 902 is also provided. If the cap wafer contains lenses or apertures, etc. 903, 904, 905, the lenses and apertures 903, 904, 905 are aligned with their respective opposing base recesses 906, 907, 908. The cap wafer is mounted to the backside 909 of the base. The cap wafer 902 may be secured by glass frit, epoxy, or other methods known in the art of semiconductor wafer capping.

Some applications may benefit from including a filter or lens in a recess prior to mounting a cap wafer. In an alternate embodiment 920, as illustrated in FIG. 9B for example, a filter 921 may be placed into a recess 922 before a backside cap wafer 923 is mounted to the base 924. In some embodiments, a backside cap wafer 923 may have an aperture over the filter, for example, to act in conjunction with the filter. A cap wafer may include a filter 924, for example, to selectively pass some frequencies of electromagnetic radiation to an underlying lens 921.

Figure 10A:
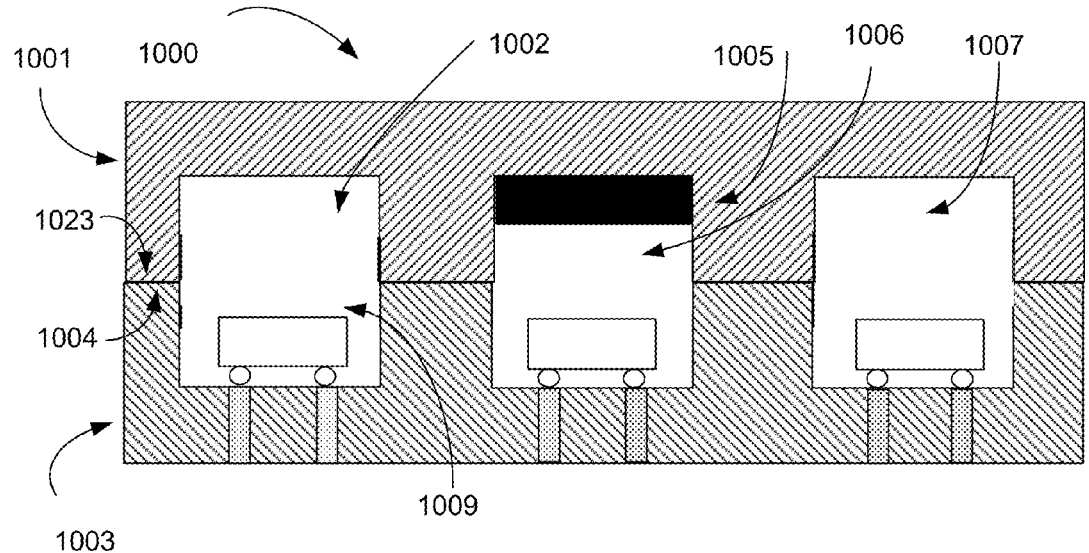
FIG. 10A and FIG. 10B schematically illustrate an alternate cap embodiment process.

Some applications may benefit from a cavity to host a sensor, which cavity is larger than the recess itself. In some embodiments 1000, a backside cap member 1001 may also include one or more recesses 1002, and one or more of the cap recesses 1002 may correspond to one or more base recesses 1009, as illustrated in FIG. 10A. When coupled to the base 1003, one or more cap recesses 1002 may face one or more base recesses 1009, so that the opposing recesses (1002 and 1009) form a cavity 1007 with a volume approximately equal to the volumes of the two adjoining recesses.

Figure 10B:
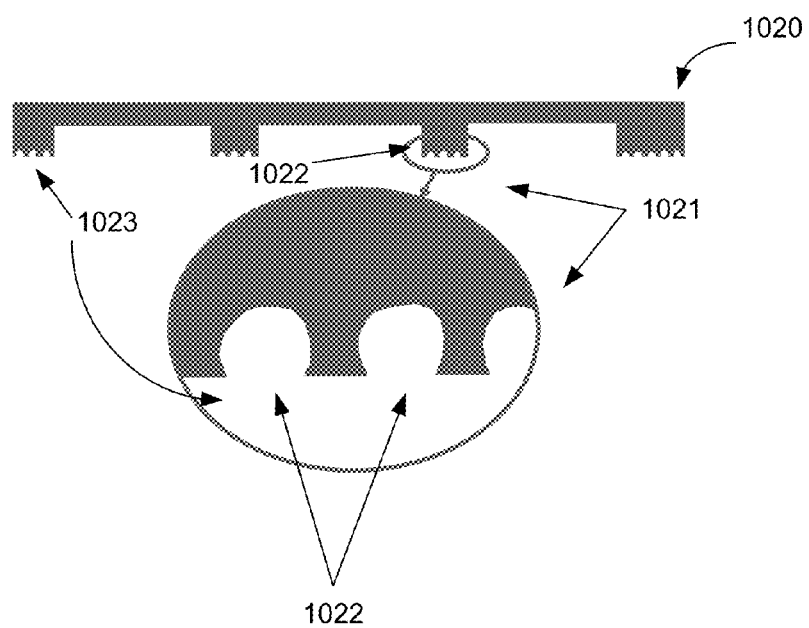

The cap 1001 may also incorporate a locking feature to improve adhesion of the cap 1001 to the base 1003. FIG. 10B illustrates a locking feature and includes an enlarged portion to show serrations, or small voids 1022, in the surface of the cap 1023 that meets the surface 1004 of the base. These serrations or voids 1022 may enhance the adhesion of the cap 1020 to the base 1003 by, for example, increasing the surface area of the cap surface 1023, so that the adhesive has more surface are to which it may adhere. In illustrative embodiments, a glass frit (not shown) may couple the cap 1020 to the base 1003, and in doing so may fill into the serrations or voids 1002.

A benefit of a cap member with a cap recess is that the cap recess may also include an opaque coating 1005 over at least a portion of its surface. In alternate embodiments, one or more recesses 1006 in a cap wafer have a coating 1005 within a recess to block, or partially block, incident radiation.

Laminated Cap

Figure 11A:
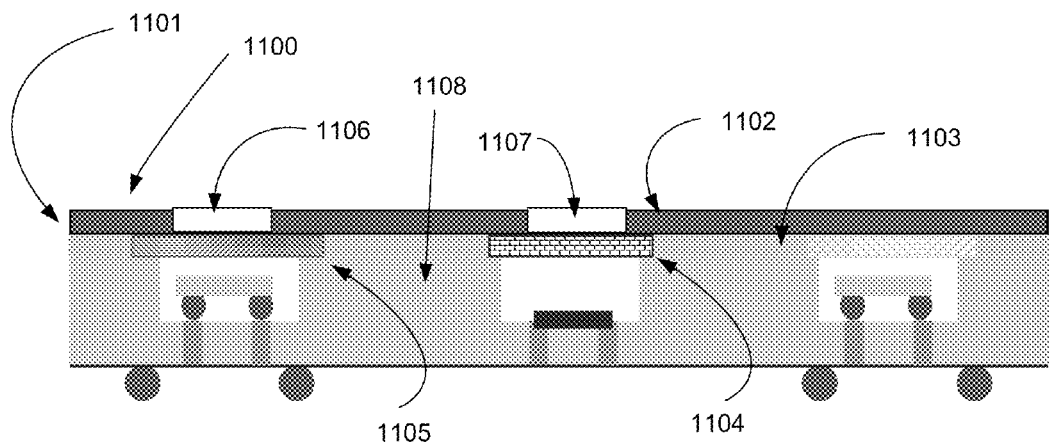
FIG. 11A and FIG. 11B schematically illustrate another embodiment and process.

A cap wafer 1100 may, in some embodiments, have a multi-layered cap member, such as a laminated member 1101, as illustrated in FIG. 11A. For example, a cap may include a silicon layer 1102 and a film layer 1103, or a silicon layer 1102 and a laminate layer 1103. The laminate cap member 1101 could comprise silicon, or could be free of silicon. A laminated cap member that does not include a layer fabricated from silicon may easier and less expensive to acquire or produce. The laminate cap member 1101 may even be prefabricated in a process different from the process used by make the substrate.

A laminate/film 1103 that incorporates lens/filters etc. 1104, 1105 may act as an interface between the cap silicon 1102 (possibly with openings 1106, 1107) and the base 1108. The film 1103 can be manufactured separately and customised to fit specific wafer sizes/sensor arrays and arrangements.

Figure 11B:
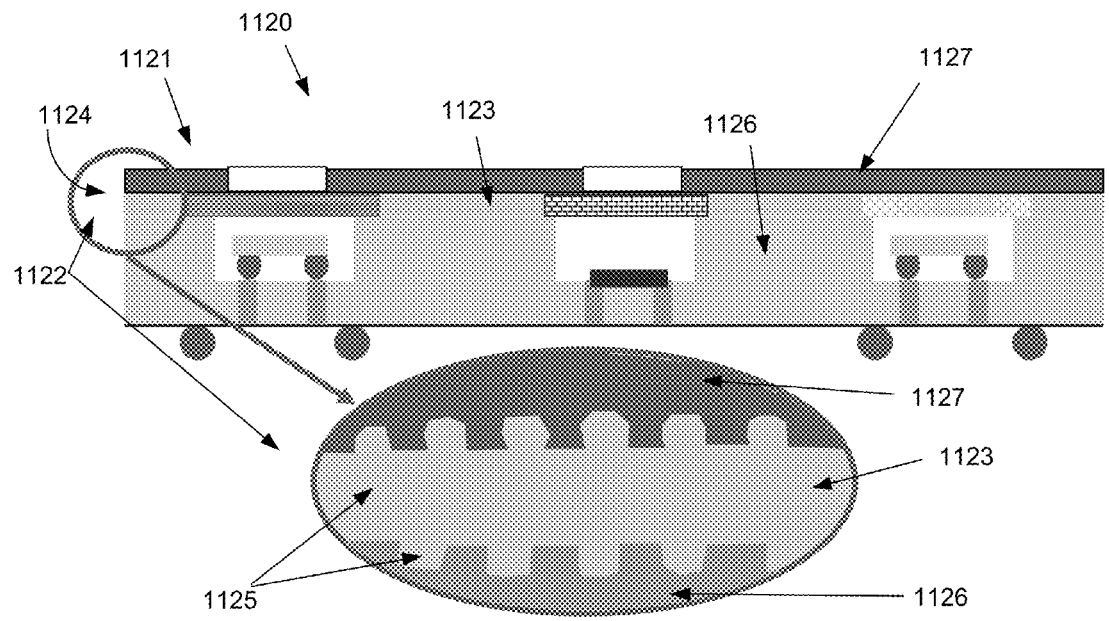

A laminated cap 1121 may also incorporate features, such as a locking feature 1122, to improve adhesion of film/improve robustness of construction of an assembly 1120, as illustrated in FIG. 11B, for example. Data show that such a member may be subjected to stresses due to the mismatch in the coefficient of thermal expansion between the dissimilar material layers in a multilayered structure. In some structures, the stresses [such as shear and peeling stresses, for example] are greatest, and may even be confined to, a region close to the free edge 1124. Therefore, the adhesion at the edge 1124 of the member may be enhanced. In FIG. 11B, a portion of the laminated cap is enlarged to show serrations, or small voids 1125, in layers 1126 and 1127. The serrations or voids 1125 may be occupied or filled by protrusions from an intervening film layer 1123. This has the effect of increasing the surface area of the layers 1123, 1126, 1127, so as to enhance adhesion, and also provides a physical interlocking to strengthen the structure 1120.

Some embodiments include a laminate base. Using a laminated base as described herein may make more efficient use of the volume of the laminate base by putting some elements, such as circuits or sensors, within the laminated base, while leaving a sensor exposed to the external environment. Such an arrangement leaves surface space free for other purposes, protects the internal elements, and provides an opportunity to include caps, filters or lenses between a sensor or circuit and the external environment.

Figure 12:
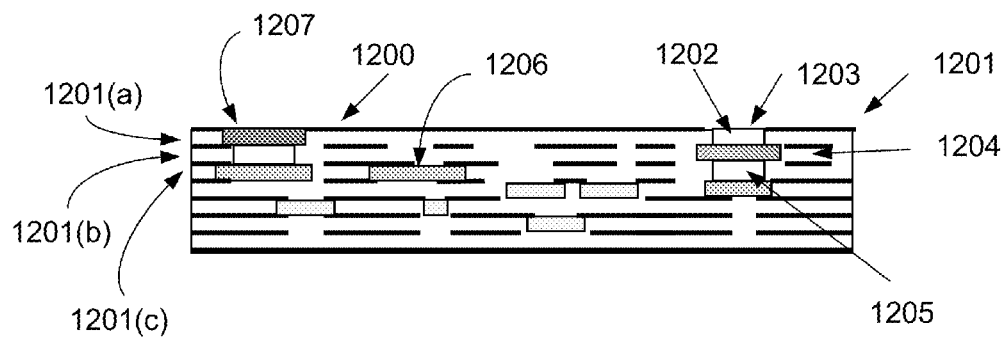
FIG. 12 schematically illustrates a laminate base.

One such embodiment 1200 is schematically illustrated in FIG. 12. The laminate base 1201 includes multiple layers [such as 1201(*a*) and 1201(*b*)], which may alternate in material or electrical conductivity. For example, some embodiments may include layers that are insulators, layers that are power or ground planes, and layers that include conductors to transmit signals from one point in the base to another.

A recess 1202 in a laminate base 1201 may be created by an aperture 1203 in a layer 1201(*a*) of the laminate base 1201, or a plurality of aligned apertures in two or more of the layers 1201(*a*), 1201(*b*) and 1201(*c*). A recess may be open to the environment, or may be closed-off from the environment. A cap 1204 above a recess 1205 may be formed by a layer 1201(*b*) above the recess. In some embodiments, a sensor or integrated circuit 1204 may occupy a layer above the recess 1205, and partially or completely close-off the recess 1205 from the external environment. A cap, lens, filter, or other integrated circuit or sensor may occupy an internal layer [such as sensor 1206 in layer, or a layer near the surface [such as lens 1207 in layer 1201(*a*)] of the laminated base 1201.

Figure 13:
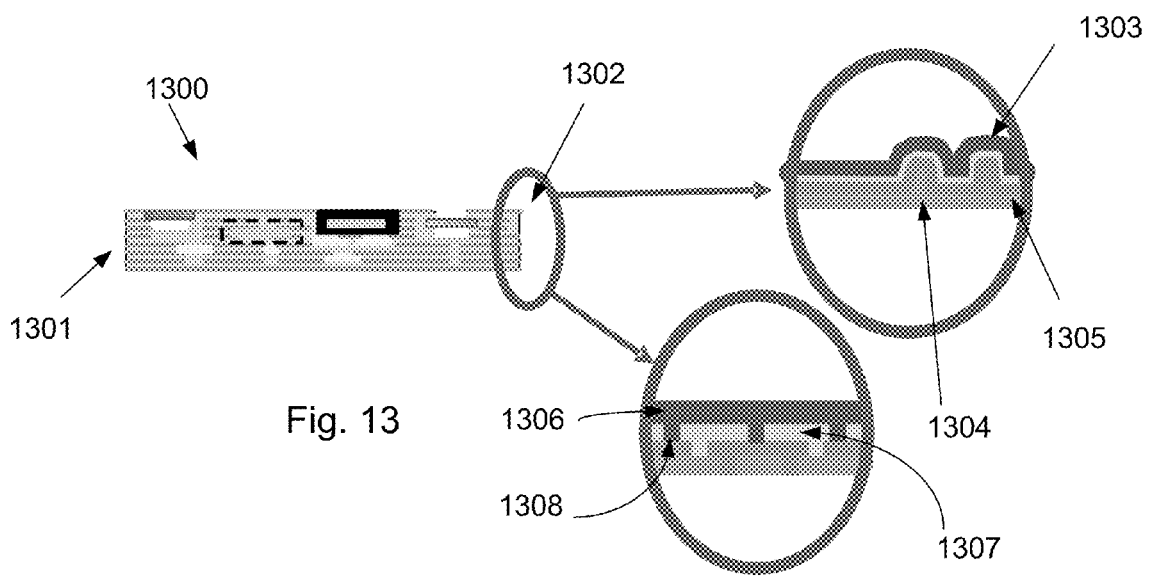
FIG. 13 schematically illustrates an alternate embodiment of a laminate base.

FIG. 13 schematically illustrates an embodiment 1300 of a laminated base 1301, and specifically illustrates details of the laminate near an edge 1302 of the laminated base. To resist de-lamination, such as from thermal stress, various layers 1303, 1304, 1305 may be made to interlock. For example, interlocking may be facilitated by increasing the surface area between two adjoining layers 1303, 1304 by having one layer 1304 extend into the other 1303, while causing the other layer 1303 to cover the extension. In an alternate embodiment, layer 1306 extends into layer 1307 by extending fingers or vias 1308 between layers. In a preferred embodiment, such interlocking features are in the region of singulation to mitigate propagation of cracks or delamination from the edges.

Figure 14A:
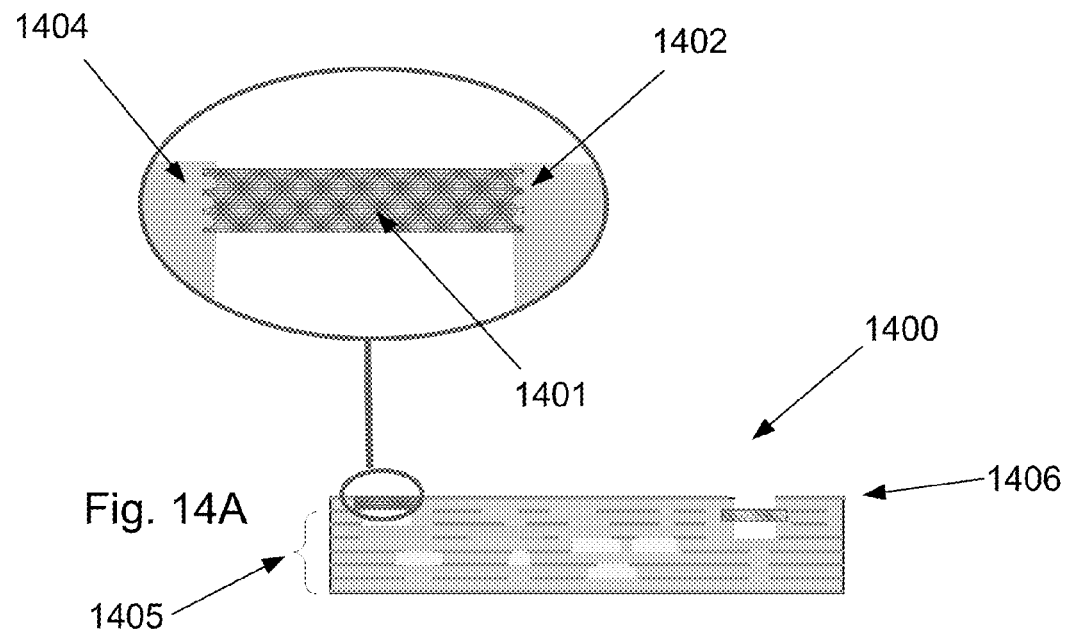
FIG. 14A and FIG. 14B schematically illustrate alternate embodiments of a laminate base.
Figure 14B:
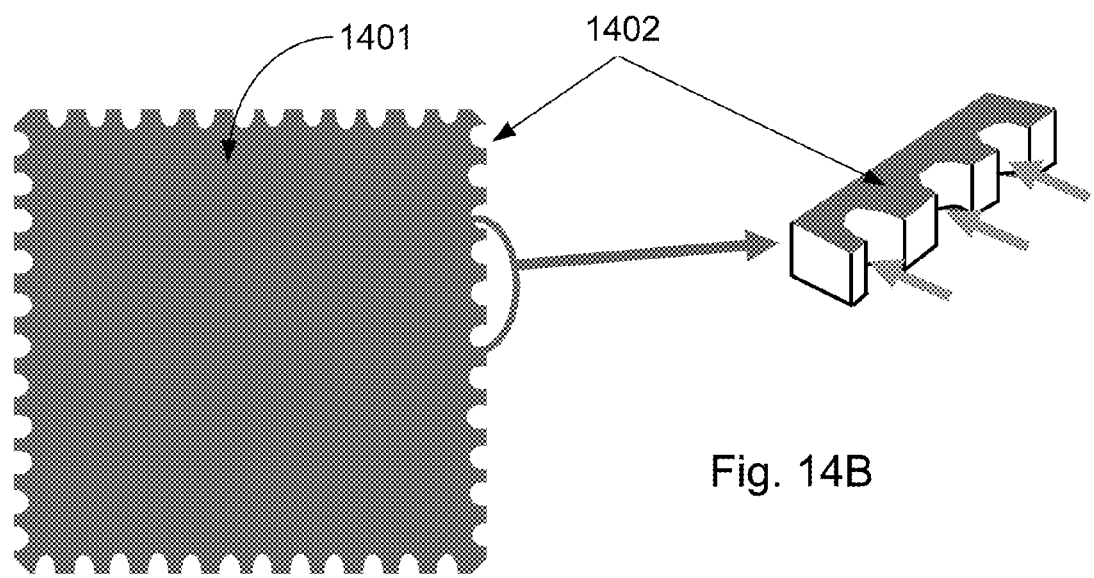

A cover, cap, filter, or lens in a laminate base may be at or near a surface of the laminate base, as highlighted in FIG. 14A. The cover, cap, filter, or lens 1401 may include openings serrated edges 1402 to increase the surface area of the edge. The openings or serrated edges 1402 may be horizontal (e.g., parallel to the major plane of the cover, cap, filter or lens) as illustrated in the enlarged portion of FIG. 14A, or vertical (e.g., perpendicular to the major plane of the cover, cap, filter or lens), as illustrated in FIG. 14B, or at any angle in-between. A layer of the laminate base 1400 may include opposing serrations or openings that can be occupied by an encapsulant 1404, so as to interlock with the openings or serrations 1402 on the cap, lens or filter 1401. One way of fabricating such a structure is to fabricate the lower layers 1405 of the laminate base 1400, and then mount or place the cap, lens or filter 1401 in the desired location. An additional layer 1406 of laminate base 1400 may then be attached or fabricated around the cap, lens, or filter 1401. For example, an epoxy layer 1406 may surround the edges of the cap, lens or filter 1401 to fill-in the serrations or openings to as to secure the cap, lens or filter to the laminate layers below 1405.

Figure 15A:
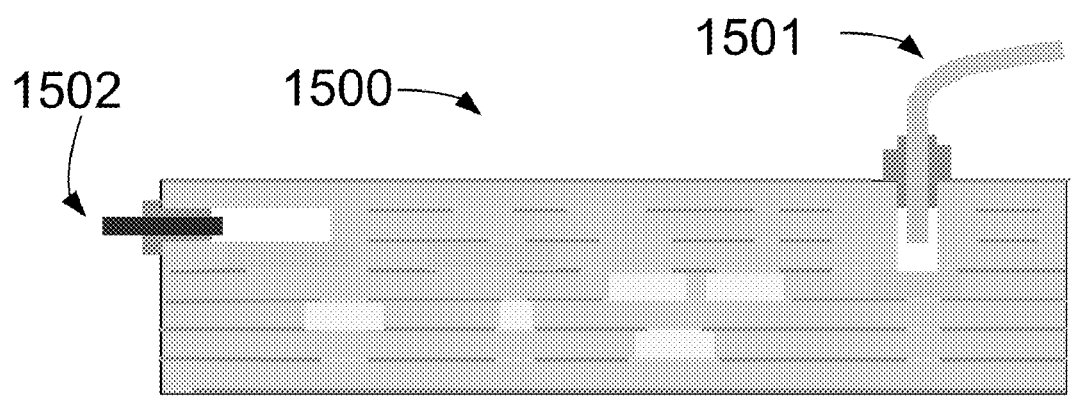
FIG. 15A and FIG. 15B schematically illustrate alternate embodiments of a laminate base.

In some situations, it may be desirable to transmit environmental media to, or into, a base. FIG. 15A schematically illustrates an embodiment in which external connectors or cables 1501 and 1502 are coupled to or into a laminate base 1500. The connectors 1501 and 1502 may transmit or transport a quantity to be measured, such as a gas, or pressure, to a sensor. In some embodiments, the external connectors 1501 and 1502 may be the end of a fibre-optic cable, so that light signals may be transported to a sensor within the laminate base. A connector or cable may couple to or into the laminate base from a frontside or backside 1501 surface, or through an edge 1502.

Figure 15B:
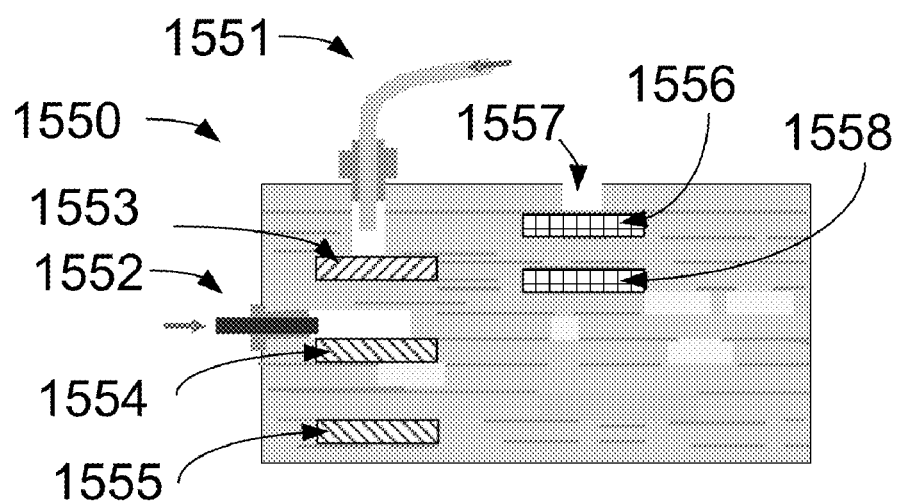

FIG. 15B schematically illustrates an embodiment in which external connectors or cables are coupled to or into a laminate base that includes embedded sensors or integrated circuits. External connectors or cables are coupled to or into the top (as illustrated by connector or cable 1551) or side (as illustrated by connector or cable 1552) of a laminate base 1550. In this illustrative embodiment, a carbon monoxide sensor 1553 is exposed to the external connector 1551 to detect that gas, while a carbon dioxide sensor 1554 is exposed to the external connector 1552 to detect that gas. A carbon dioxide gas sensor reference 1555 is embedded in the laminate and not exposed to any external environment. A pressure sensor 1556 is exposed to the environment through an aperture 1557 in the top surface, while a reference pressure sensor 1558 is embedded in the laminate and not exposed to any external environment.

Figure 16:
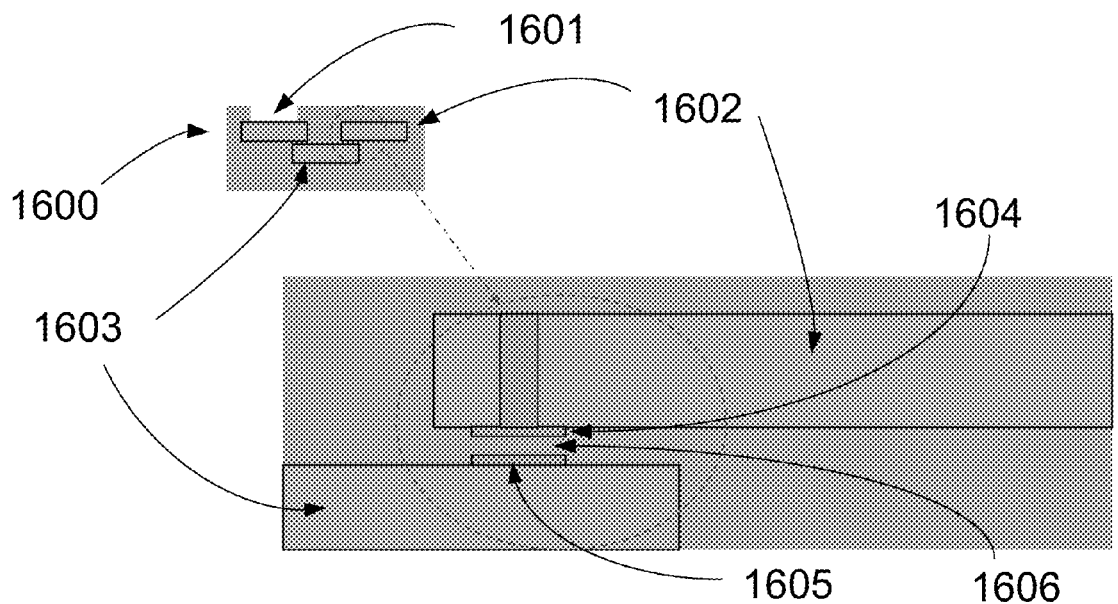
FIG. 16 schematically illustrates an alternate embodiment of a laminate base.

An illustrative embodiment including coupled inductors is schematically illustrated in FIG. 16. An enlarged view of a portion of sensor assembly 1600 is included in FIG. 16 to show detail. A sensor assembly 1600 includes a sensor die 1601, a reference die 1602, and a processor die 1603. In this illustrative embodiment, the reference die 1602 and processor die 1603 are in electrical communication via coupled inductor coils 1604 and 1605. A method of communication using inductively coupled coils is illustrated in U.S. Pat. No. 7,075,329. The inductor coils 1604 and 1605 are separated by one or more layers of the laminate base, 1606.

Figure 17:
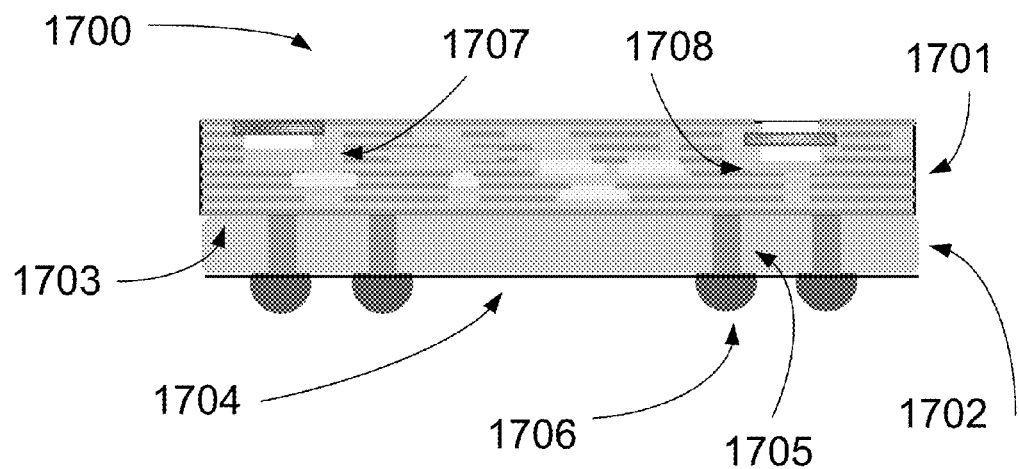
FIG. 17 schematically illustrates an embodiment of a combined laminate base and processor circuit.

An exemplary embodiment of a system 1700 may include a substrate, such as a multilayer laminate substrate 1701, mounted to an integrated circuit 1702, as schematically illustrated in FIG. 17. The laminate substrate 1701 may be mounted to either major surface, 1703, 1704, of the integrated circuit 1702, for example. Mounting may be implemented by flip-chip methods or other means known in the art for mounting one member to another.

In this embodiment 1700, the laminate substrate 1701 (containing the sensing structures, lenses, filters, etc., 1707, 1708) is mounted on a silicon substrate or integrated circuit 1702, which may include circuitry to drive or control the sensing system 1700 or its individual sensors 1707, 1708, or process the output of one or more of the sensors 1707, 1708. An advantage of such an embodiment is that the laminate substrate 1701, or other such embedded structure, could be tailored to suit different sensing applications as required, simply by designing variations that all mount to the same processing integrated circuit. The processing integrated circuit 1702 could be, for example, a digital signal processor ("DSP"), an application-specific integrated circuit ("ASIC") or other integrated circuit adapted to mount to and electrically communicate with the laminate substrate 1701.

A variety of laminate substrates 1701 may be adapted to mount to one design of integrated circuit 1702. For example, a first laminate substrate may contain pressure sensors (1707; 1708), while a second laminate substrate may contain gas sensors (1707; 1708), yet either of the first or second laminate substrates could be mounted to the same type of DSP integrated circuit 1702, to create a modular systems 1700. Through-silicon vias, such as 1705, may conduct signals through the integrated circuit 1702 to or from the laminate substrate 1701. Further, solder balls 1706 or other known means of connection may mount the assembly 1700 to a circuit board or other structure (not shown).

Figure 18:
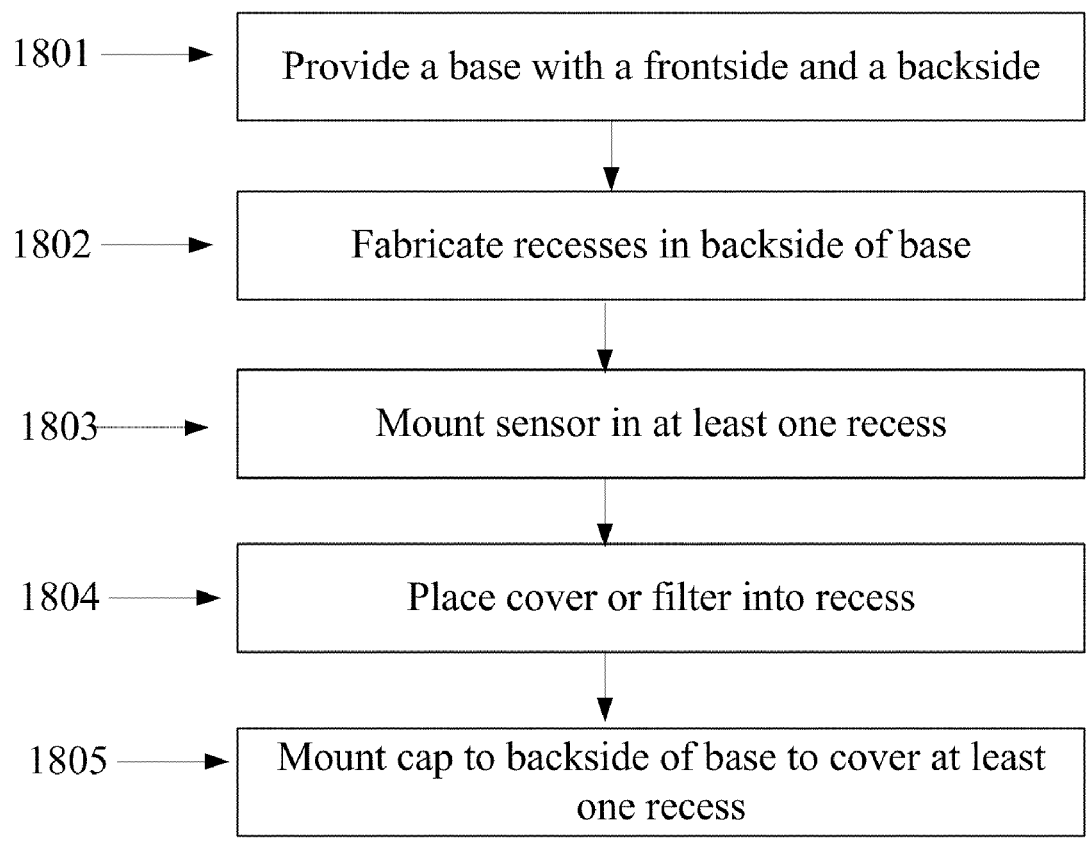
FIG. 18 shows a process for fabricating a multisensor system in accordance with illustrative embodiments.

FIG. 18 shows a process of forming a sensor system in accordance with illustrative embodiments. First, a base is provided at step 1801. The base has a frontside surface and a backside surface. The frontside may include active circuitry, or conductors, or both. The base may be, for example, a semiconductor, or a laminate member. Then, a plurality of recesses are fabricated at step 1802 into the base. Such recesses may be fabricated simultaneously with the fabrication of the base, for example if the base is a laminate member. Then at least one sensor is mounted into at least one of the recesses at step 1803. Multiple sensors, or other elements such as integrated circuits or discrete components may be mounted in a single recess, and may be in a stacked formation, or side-by-side. Optionally, a filter, cap or lens, for example, or a cover, or a cover including a filter or lens, may be mounted at step 1804 to the backside surface or within a recess. The filter, cap, lens or cover may hermetically seal at least one cavity. Optionally, a cap wafer may be mounted to the backside of the base to cover at least one recess, at step 1805. In alternate embodiments, other features described herein may be fabricated on or in a recess or on or in the base.

The embodiments of the invention described above are intended to be merely exemplary; numerous variations and modifications will be apparent to those skilled in the art. For example, some steps in processes may be combined or reordered, or even skipped. All such variations and modifications are intended to be within the scope of the present invention as defined in any appended claims.

What is claimed is:

1. A sensor system comprising:
   a base having a frontside surface, and a backside surface comprising a plurality of recesses, and wherein the base further comprises at least one recess via from a recess to the frontside surface;
   a plurality of sensors, two or more of the recesses each having at least one of the sensors; and
   at least one of the two or more recesses having a port configured to permit entry of environmental media for receipt by its sensor(s).

2. A sensor system according to claim 1, further including circuitry coupled to at least two of the plurality of sensors, wherein the circuitry coordinates the activity of the at least two sensors.

3. A sensor system according to claim 1 wherein at least one recess has at least one sensor and at least one additional circuit element.

4. A sensor system according to claim 3 wherein the at least one sensor and the at least one additional circuit element are in a stacked configuration.

5. A sensor system according to claim 3 wherein the at least one sensor and the at least one additional circuit element are in a side-by-side configuration.

6. A sensor system according to claim 3 wherein the at least one sensor is encapsulated.

7. A sensor system according to claim 1, wherein the port comprises an open aperture.

8. A sensor system according to claim 1 wherein at least one recesses further comprises one of a cover, a filter that selectively permits environmental media to access the recess and a lens that focuses environmental media.

9. A sensor system according to claim 8 wherein the filter, cover or lens further comprises an interlocking feature adapted to secure the filter to the base.

10. A sensor system according to claim 1, further comprising a cover with at least one of a filter that selectively permits environmental media to access the recess and a lens that focuses environmental media.

11. A sensor system according to claim 10, wherein the cover comprises a laminated member.

12. A sensor system according to claim 11, wherein the laminated member is prefabricated prior to being coupled to the backside surface.

13. A sensor system according to claim 10 wherein the cover comprises circuitry.

14. A sensor system according to claim 1, wherein at least two of the sensors sense the same environmental media.

15. A sensor system according to claim 1, wherein at least two of the sensors sense different environmental media.

16. A sensor system according to claim 1 comprising a first sensor in a first recess, and a second sensor in a second recess, wherein the first sensor and the second sensor are configured to sense the same environmental media, and the second sensor is isolated from the environment external to the second recess.

17. A sensor system according to claim 1 wherein the base comprises silicon.

18. A sensor system according to claim 17 wherein the base further comprises integrated circuits on the frontside surface.

19. A sensor system according to claim 1 wherein the base further comprises a via all the way through the base.

* * * * *